(12) United States Patent
Heidinger et al.

(10) Patent No.: US 6,605,949 B2
(45) Date of Patent: Aug. 12, 2003

(54) QUASI-HEMISPHERICAL FABRY-PEROT RESONATOR AND METHOD OF OPERATING THE SAME

(75) Inventors: Roland Heidinger, Karlsruhe (DE); Reiner Schwab, Karlsruhe (DE); Jakob Burbach, Eggenstein-Leopoldshafen (DE); Jürgen Halbritter, Bruchsal (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 0 days.

(21) Appl. No.: 09/754,565

(22) Filed: Jan. 5, 2001

(65) Prior Publication Data

US 2001/0008378 A1 Jul. 19, 2001

Related U.S. Application Data

(63) Continuation-in-part of application No. PCT/EP99/05019, filed on Jul. 15, 1999.

(30) Foreign Application Priority Data

Aug. 1, 1998 (DE) .......................................... 198 34 854

(51) Int. Cl.$^7$ .............................................. G01R 27/04
(52) U.S. Cl. ...................... 324/636; 324/633; 324/71.6; 324/719
(58) Field of Search ................................ 324/632, 633, 324/636, 719, 71.6; 372/92, 99, 107

(56) References Cited

U.S. PATENT DOCUMENTS

| 4,968,945 | A | * | 11/1990 | Woskov | ....................... 324/636 |
| 5,239,269 | A | | 8/1993 | Martens et al. | .............. 324/636 |
| 5,440,238 | A | * | 8/1995 | Martens | ....................... 324/636 |
| 5,506,497 | A | * | 4/1996 | Klein | ........................... 324/636 |

FOREIGN PATENT DOCUMENTS

JP 09 199297 7/1997

OTHER PUBLICATIONS

Komiyama, B. et al., "Millimeter Wave Resistance Measurements of High–TC Superconductive Thin Films Using a NB Open Resonator",. European Micrwoave Conference Proceedings, GB, Nexus Business Communications. Sep. 5, 1994, pp. 986–991.

Komiyama et al., "Open Resonator for Precision Dielectric Measurements in the 100GHZ Band", IEEE Trans. On Microowave Theory and Techniques, vol. 39, No. 10, 10/99, pp. 1792–1796.

Hirvonen et al., "Measurement of Dielectrics at 100GHz with an Open Resonator Connected to a Network Analyzer", IEEE Transactionss on Instrumentation and Measurement, US, IEEE Inc. New York, vol. 45, No. 4, Aug. 1, 1996 pp. 780–786.

* cited by examiner

Primary Examiner—Christine K. Oda
(74) Attorney, Agent, or Firm—Klaus J. Bach

(57) ABSTRACT

In a quasi-hemispherical Fabry-Perot resonator for the non-destructive determination of the surface resistance $R_s$ of electrically conductive thin material films, spherical and planar mirrors are disposed opposite each other in a double shielded cooled resonator space structure supported on individual base plates and the planar mirror, on which a wafer with the thin material film is supported, is mounted on a support arm which extends through the double shield structure. Shield sections through which the support arm extends are supported on pivot arms which are pivotally mounted in the center of the base plates and the shield sections are engaged by the support arm so that they move along with the support arm when the support arm is moved sidewardly for a positioning change of the planar mirror thereby preventing radiation leakage from the resonator space.

6 Claims, 4 Drawing Sheets

Fig. 3a
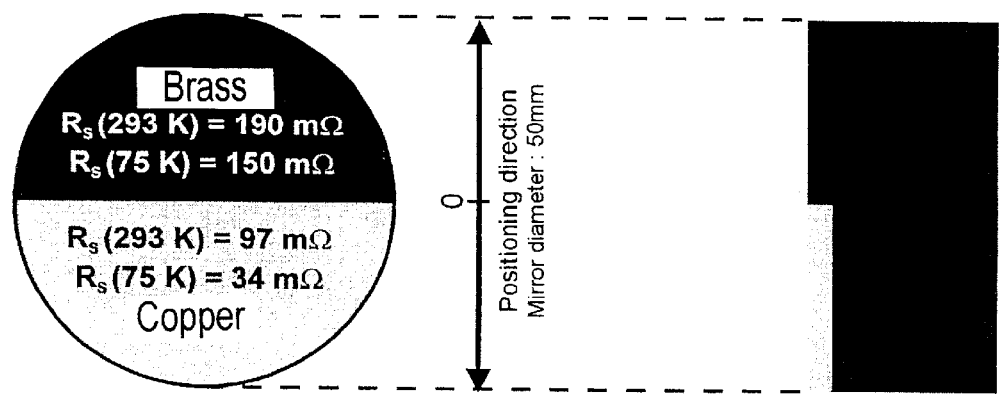
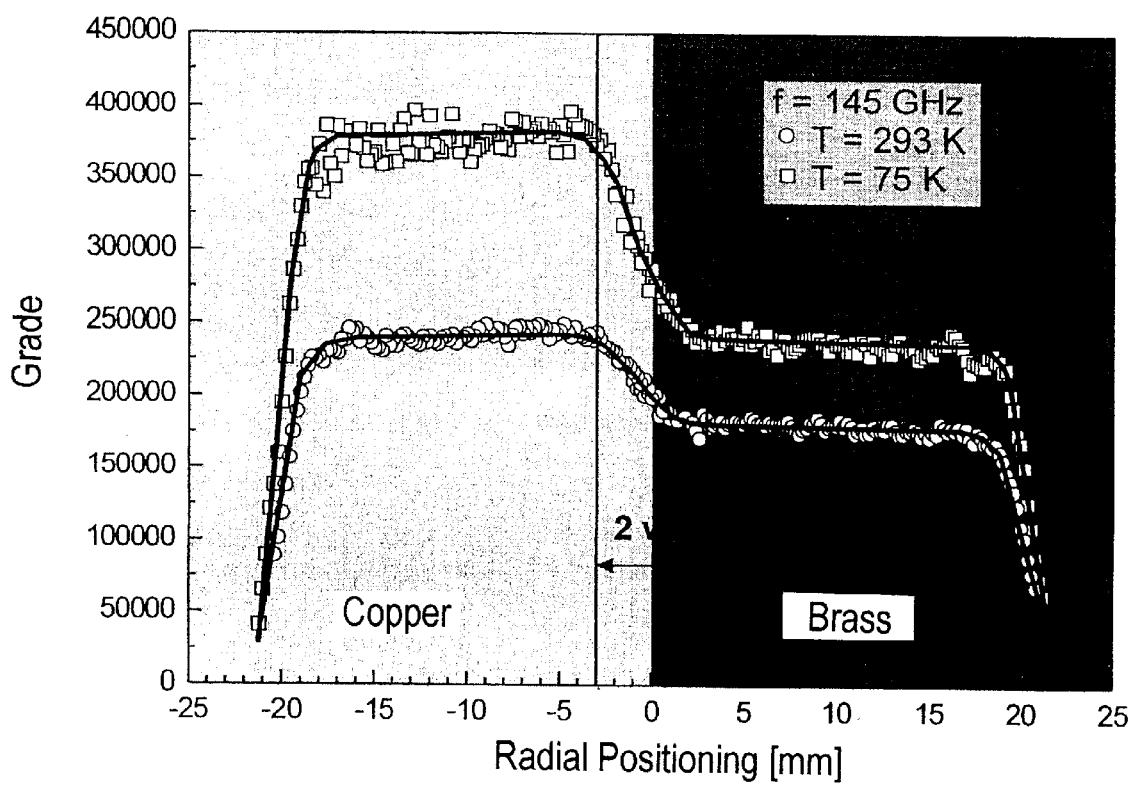
Fig. 3b

QUASI-HEMISPHERICAL FABRY-PEROT RESONATOR AND METHOD OF OPERATING THE SAME

This is a continuation-in-part application of international application PCT/EP99/05019 filed Jul. 15, 1999 and claiming the priority of German application 198 34 854.1 filed Aug. 1, 1998.

BACKGROUND OF THE INVENTION

The invention resides in a quasi-hemispherical Fabry-Perot resonator for determining the surface resistance of a thin-film material in the mm wave range.

For the manufacture of information processing components (for example, filters, oscillators) thin-film materials with good conductivity, which may also consist of a high temperature superconductive material (for example, YBCO), are structured in a particular way. The thin material films are formed on large surface area substrates (wafers) by sputter- and vapor deposition processes. For the certification of a suitable film manufacturing process, certain material parameters (among others the transition temperature $T_e$, the critical current density $j_c$) are determined in a non-destructive manner, wherein the surface current resistance $R_s$ is the most important. With localized scanning, which determines this parameter over the wafer surface area of interest in a quantitative manner, the reproductivity and the homogeneity of the superconductive film properties are determined.

Regarding the use of Fabry-Perot resonators for the temperature dependent determination of $R_s$ at low temperatures using superconductive mirror materials (niobium) reports are available by Komiyama et al. (in Appl. Phys. LeH. 64(4), Jan. 22, 1996, p. 562–563 under the title Penetration depth measurements . . . ") and in the WUB-DIS 94-9 by S. Orbach-Werbig under the title "Oberflächenimpedanz epitaktisch autgewachsener $Yba_2 Cu_3O_{7-s}$films at 87 GHz". Whereas the first publication reports of no provisions for localized measurements, in accordance with the second publication a displacement was provided for by a hand-operated drive for rotating the probe. Localized $R_s$ determinations at a given temperature (77° K.) are performed using normally conductive mirror materials (aluminum): Martens et al. (U.S. Pat. No. 5,239,269).

The convention documents of the MIOP 97 by R. Heidinger and R. Schwab disclose a quasi-hemispherical Fabry-Perot resonator for determining the surface resistance in the millimeter wave range. Changes of the DC conductivity in the mirror materials and changes of $R_s$ resulting therefrom were found over a wide temperature range of 20–340° K. They were recorded for various material configurations (Cu, Ag, brass) by way of grade measurements over the whole test specimen, that is, not in a localized manner. In a second resonator with an especially focused mirror configuration, which resonator can be operated only at room temperature, the registration of local $R_s$—inhomogeneities is demonstrated by way of demonstration mirrors with an abrupt resistance change. The experiment is made in the open, that is, not in a closed environment.

The solution formulas known so far do not provide for any, or at least not for any satisfying, combined localized and temperature dependent quantitative determination of the $R_s$—values. In the described systems, which are based on superconductive niobium, it is not possible to arrange the coupling geometry in such a way that stray losses at the coupling openings are small. The reason herefor is that, in comparison with the copper used in connection with the invention, niobium is difficult to machine. Another reason is the necessary high-frequency examination of the geometry below the shift temperature of niobium (9.4° K.), which does not permit any direct corrective measures. With these experiments, so far, no absolute values for the localized surface resistance $R_s$ have been determined.

Solution formulas of the localized measurements are failing because there is no reliable systematic definition, since the manual object guidance is sluggish and not sufficiently accurate (Orbach (1994)). The localized measurements with (quasi) co-focal Fabry-Perot resonators do not have the necessary stability of the temperature environment because they are not equipped with a kryo-system appropriate for performing T-variable measurements.

It is the object of the present invention to delimit unsuitable film areas by identifying areas with increased surface resistance values, which are the result of outside influences. Predetermined comparison measurements of the temperature depending on $R_s$ over the surface area will provide for a suitable data base for quantifying the amount of the outside influence on the material quality and the local temperature gradient for a systematic correlation with the sputtering or vapor deposition parameters.

SUMMARY OF THE INVENTION

In a quasi-hemispherical Fabry-Perot resonator for the non-destructive determination of the surface resistance $R_s$ of electrically conductive thin material films, spherical and planar mirrors are disposed opposite each other in a double shielded cooled resonator space structure supported on individual base plates and the planar mirror, on which a wafer with the thin material film is supported, is mounted on a support arm which extends through the double shield structure. Shield sections through which the support arm extends are supported on pivot arms which are pivotally mounted in the center of the base plates and the shield sections are engaged by the support arm so that they move along with the support arm when the support arm is moved sidewardly for a positioning change of the planar mirror thereby preventing radiation leakage from the resonator space.

The invention resides in the combination of a highly developed invention measuring technique for a high resolution quantitative determination of $R_s$ by means of a (quasi) hemispherical resonator arrangement with copper mirrors and a suitable evaporation kryostatic system which, using two radiation shields and a suitable placement of computer-controlled adjustment elements, provide for a reproducible position and temperature variation of the superconductive thin film sample in the millimeter wave beam.

The inner radiation shield is completely surrounded by an outer shield. Both consist of a base plate through which a coolant flows and on which the mirror cover is disposed. The two base plates are, with respect to the coolant flow, arranged in series wherein the coolant flows first through the inner radiation shield, which is supported on the outer radiation shield in a mechanically stable manner by legs which have a low heat conductivity.

The quasi-hemispherical resonator is supported on the base plate of the inner radiation shield in good heat transfer contact therewith. The spherical mirror is firmly mounted on the base plate in good heat transfer relationship therewith. Symmetrically to the projected resonator axis, the base plate carries at least two heating elements, whose heat input to the spherical mirror is monitored and is controlled by temperature sensors arranged in the heat transfer path to the spherical mirror. The plane mirror is disposed on the movable extension arm, which has a low heat conductivity and therefore is connected to the base plate by way of a flexible (metal) band having a good heat conductivity for maintaining the defined kryosystem temperature. It provides for a certain displacement freedom, particularly a rotation of the mirror up to 360° about the resonator axis. Furthermore, the plane mirror can be separately heated by means of a heating element mounted thereon. The temperature of the mirror is monitored and controlled by an associated temperature sensor. The heating element provides for well-defined heat input for obtaining a thermal equilibrium between the mirrors also during warm-up.

The second radiation shield is also supported on the mounting plate in heat transfer uncoupled relationship therefrom. The resonator is mounted on the mounting plate indirectly and the extension arm is mounted with its base directly on the mounting plate.

To accommodate the low-conductivity extension arm, each of the radiation shields includes a window through which the extension arm extends so that they can be removed during necessary manipulations (for example, a change of the sample) within the resonator space. In order to keep the radiation shields always closed such that, during examination, no radiation can escape, a sectionally overlapping double wall is provided in the area of the extension arm. The two wall sections are supported on their respective pivot arms. The support arm for the inner radiation shield is rotatably supported at the center point of the inner base plate and, correspondingly, the support arm for the outer radiation shield is rotatably supported on the support arm of the lower base plate. Both wall sections are movable thereby in a circular motion.

Cryogenic apparatus are often so designed that their cooling capacity can be as small as possible. That means that the masses in the cold cryo-areas should be as small as possible. There is however another opposite need because of a possible thermal de-tuning of the resonator during the selection period of a resonance. This de-tuning should be negligible. Therefore, the two mirrors have a minimum mass or an equally large heat capacity.

Since the heat transfer band provided for a good heat coupling of the plane mirror with the inner base plate must be relatively long to permit complete rotation of the mirror, means must be provided which prevent the heat transfer band to drop into the resonator at any rotational position of the mirror. Therefore the mirror is surrounded by a funnel-shaped collar.

The heat transfer uncoupling between the two base plates is preferably realized by glass fiber legs. The uncoupling between the outer base plate and the mounting plate is achieved in the same way. Other materials, which sufficiently prevent heat transfer and are suitable for the system, may also be used. The support also should prevent the input of mechanical bending moments into the plates. This is particularly true for the support of the mounting plates on the base plate of the vacuum chamber, which extends around the whole arrangement.

The design of the two radiation shields remains the most simple if the adjustments on the resonator during measurements are limited to the extension arm. Therefore, all adjustment elements for the extension arm are preferably disposed outside the two radiation shields. Furthermore, they are arranged outside the radiation shields in order to prevent the input of parasitic heat into the resonator space.

Is also important for the operation of the adjustment elements that they are disposed in a space with room temperature. Only then can they be operated properly.

With the resonator according to the invention, a method for the non-destructive and contact-free determination of the localized and temperature-dependent surface resistance $R_s$ of electrically conductive thin-film materials is made possible.

Both surface-coated mirrors are adjusted with respect to each other. The plane mirror is mounted on the extension arm, which is mounted so as to be movable with three degrees of freedom. In this way, each point of the exposed surface of the thin film deposited on the planar mirror can be moved into the focus of microwave emitted from the uncoupling opening of the spherical mirror in a delicately stepped manner.

By way of the two radiation shields, defined cryogenic environments are provided which permit quantification of the temperature influence.

The measuring process is performed under the control of a computer in order to characterize a measured thin film layer within acceptable, particularly economically acceptable periods.

The microwave reflected from the test sample is recorded by a sensitive detector system whose input is formed by the uncoupling opening of the spherical mirror directly adjacent the uncoupling opening. The transmission of the microwave is recorded as a function of the frequency and is parameterized in the computer by the adaptation according to the smallest error squares following a Lorentz-distribution. From this, the grade value is determined, which is corrected by the contributions of the reflection losses at the spherical mirror (Surface resistance $R_{sph}$) and the dispersion losses at the in-coupling and out-coupling openings. Finally, the location and temperature-dependent value of the surface resistance is determined therefrom.

The location- and temperature variable measurement points, which are obtained by a fully computer-controlled measurement process control, permit, for the first time, a quantitative qualification of the various film areas in the form of a model-based adaptation and a temperature gradient determination. In this way, a use-relevant data basis is provided for the certification and a well-directed improvement of the film manufacture.

Below the invention will be described in greater detail on the basis of the accompanying drawings.

BRIEF DESCRIPTION OF THE DRAWINGS

FIG. 3a shows, in a demonstrative way, a copper-brass mirror, FIG. 3b shows the respective Q-factor depending on the radial location.

DESCRIPTION OF A PREFERRED TEMPERATURE

Figure 1:
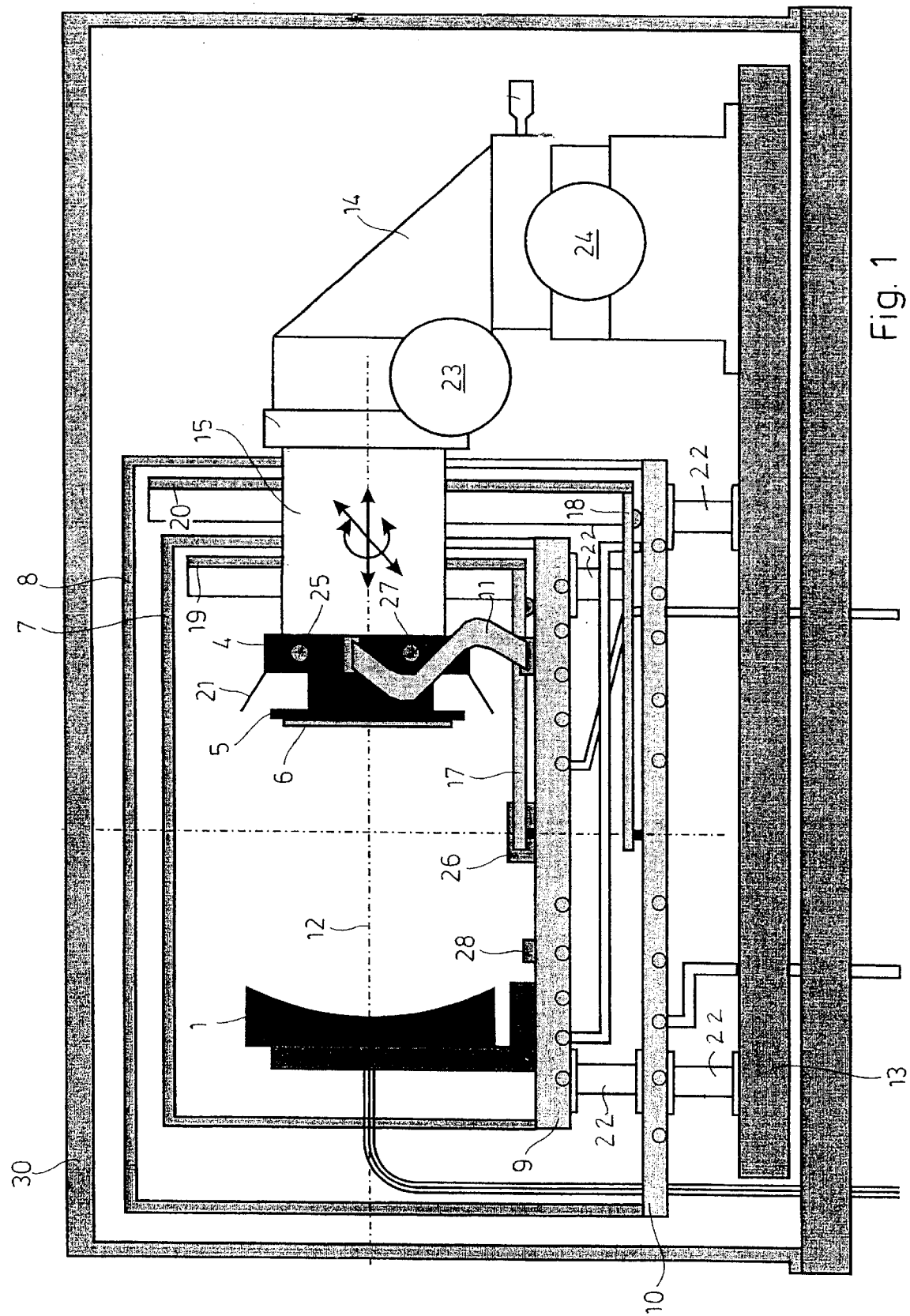
FIG. 1 shows schematically the arrangement of the hemi-spherical spherical Fabry-Perot resonator.
Figure 2:
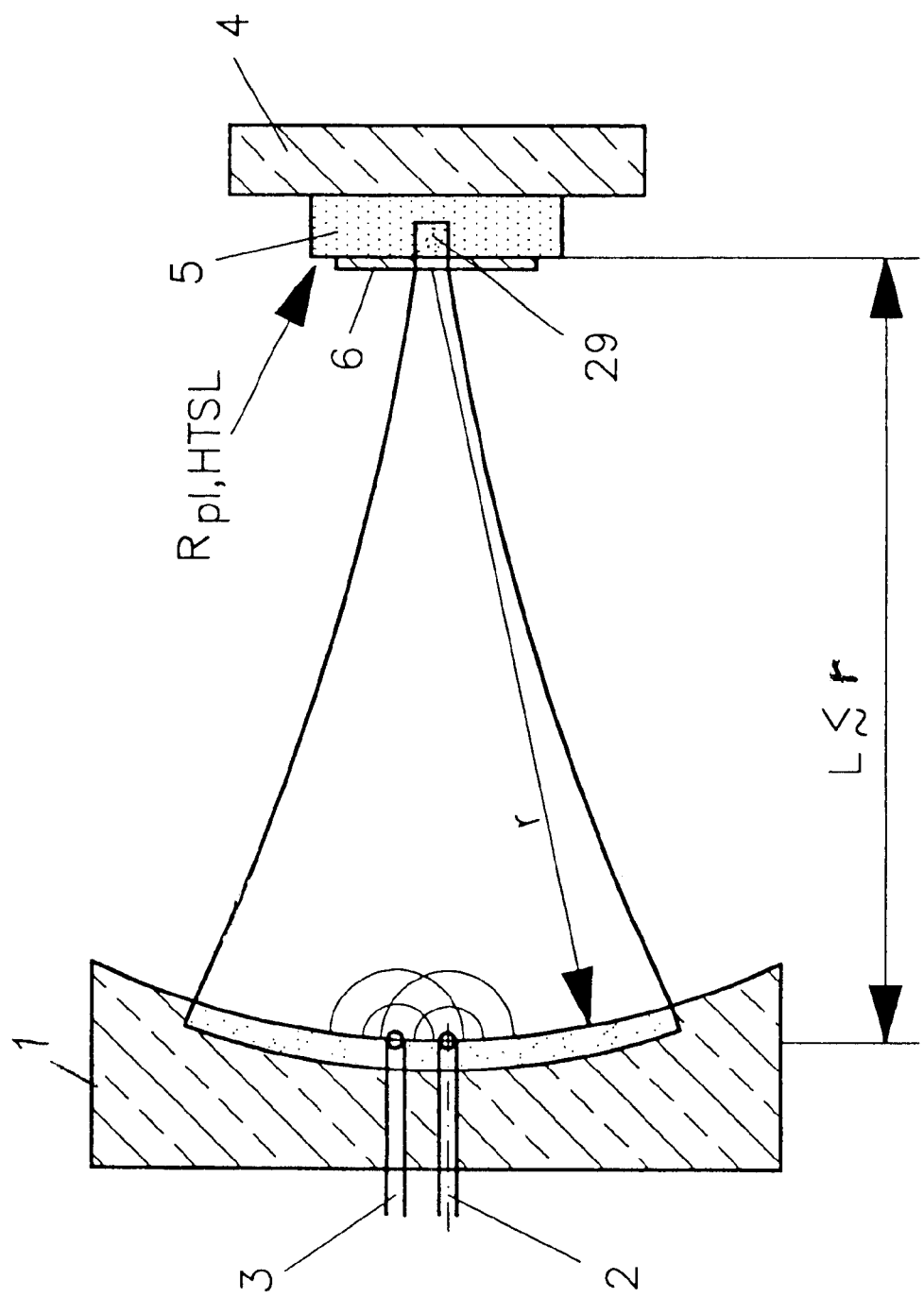
FIG. 2 shows schematically the resonator alone.

The non-destructive and contact-free determination of $R_s$ is achieved by way of an analysis of the Gauss base modes in a (quasi) hemispherical Fabry-Perot resonator. This resonator consists of a spherical and a planar copper mirror 1, 4 of high surface quality and electrical conductivity. The two mirrors are arranged at such a distance from each other that the mirror distance L is slightly smaller than, or at most equal, the mirror radius r. Two coupling openings 2, 3 designed for high frequencies are formed into the mirror 1 by an electro-erosion technique (see FIG. 2), which openings serve for the incoupling and, respectively, the out-coupling of the millimeter wave signal (f=144–146 GHz).

On the planar mirror 4, a wafer 5 with a thin-film material sample deposited thereon is mounted by clamps for exposure to the microwave. The energy transmission through the resonator, that is, the reflection at the surface of the thin film material sample 6 is recorded as a function of the frequency by means of a sensitive detector system whose input is the incoupling opening 2 of the spherical mirror 1 (see FIG. 2). The uncoupling opening 2 is, in this case, disposed on the resonator axis 12, the uncoupling opening 3 is disposed next to it. It is only important that, for radiation-optical reasons, the openings are near the resonator axis 12 and closely adjacent each other.

It is very important that a uniform cryogenic environment around the resonator arrangement is provided in order to prevent temperature changes which could lead to a widening of the resonance lines and, as a result, to a falsification of the grade or quality values recorded. This is achieved by the two radiation shields 7, 8 of which the inner shield 7 is at cooling surface temperature and the outer shield 8 is at discharge gas temperature because the cooling gas flows in series through the channels of the base plates 9, 10 and the upper base plate 9 is first contacted by the cooling gas.

With a small heat input, which is provided for by the computer-controlled heat output of the heating elements 25, 26 on the base plate 9 and on the planar mirror 4, the temperature of the measuring system can be varied above the achievable minimum temperature (10° K. with liquid helium as coolant, 75° K. with nitrogen as coolant).

The reproducible displacement of the thin film material sample 6 in the millimeter wave field is achieved by means of the control elements 23, 24 on the extension arm 14, which control elements are disposed outside the two radiation shields 7, 8, but within the vacuum chamber 30. For a reliable and fine adjustment, the control elements 23, 24 are operated under the control of a computer by motors within the vacuum chamber 30, so that there is no need for vacuum penetrations. In the vacuum chamber 30, the base plates 9 and 10 are supported on a mounting plate 13 by support legs 22 which consist of glass fiber reinforced plastic material. Also supported on the base plate 13 is the support or extension arm 14, which extends with one end 15 thereof into the shielded space and supports therein the planar mirror 4 on which the wafer 5 is mounted. Support arms 17 and 18 are pivotally supported centrally on the respective base plates 9 and 10 and have connected thereto radiation shield sections 19 and 20, respectively, with openings through which the support arm extension 15 passes. The shield sections 19 and 20 are moved by the support arm upon sideward movement thereof: The planar mirror 4 has a band 11 of highly heat conductive material attached thereto for conducting heat to the base plate 9, while permitting rotation of the planar mirror 4. The planar mirror 4 carries a funnel-like rim structure 21, which prevents the band 11 from coming into contact with the thin film material sample 6. Temperature sensors 27 and 28 are provided for controlling the heat input of the heating elements 25, 26.

For demonstrating the basic capabilities of the resonator and the method for its operation, the exposed surface of the planar mirror 4 consists of the circular disc-like thin film material sample 6, which has a diameter of 50 mm and a semicircular section of copper with the other semicircular section consisting of brass. As a result, it provides an abrupt gradient for the surface resistance $R_s$. For the measurement, the focus spot 29 of the microwave of 145 GHz moves across the surface in a direction normal to the separation line between the two semi-circular sections (FIG. 3a).

In FIG. 3b, the measured resonator quality Q (grade) is plotted over the radial position of the focus spot on a copper-brass mirror forming the thin film material sample 6 (FIG. 3a) one time at room temperature (T=293° K.) and again at T=75° K. (lower curve). Measurements are taken over the whole diameter of the thin film material sample 6. In the process, the $R_s$ transition is found to be continuous from the value for brass—$R_s$=190 mΩ at T=293° K. and $R_s$=150 mΩ at T=75° K.—to the value of copper—$R_s$=97 mΩ at T=293° K. and $R_s$=34 mΩ at T=75° K.—over a distance of 2 $w_0$=6.5 mm. The quality values within the copper and brass areas are constant, but show clearly distinguished temperature dependency. The steady stepless transition from brass to copper corresponds to the calculated focus spot 2 $w_0$ of the beam in the resonator and, as a result, forms the upper limit for the localized resolution of the system. The sharp drop of the quality at the edge of the mirror results from the diffraction losses at the edge, which occur as soon as the beam begins to overlap the mirror edge.

Figures 4A, 4B:
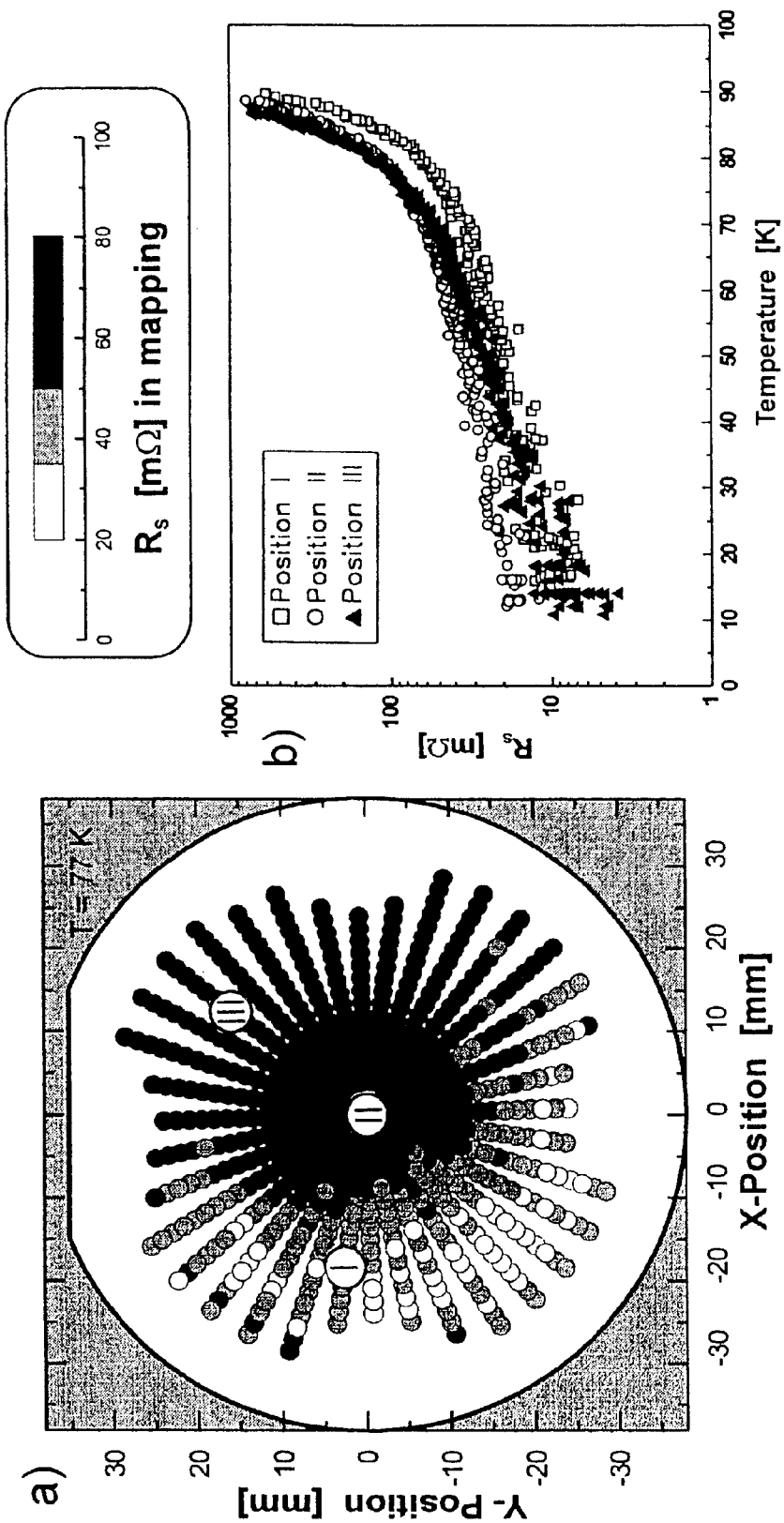
FIG. 4a shows the distribution of the local surface resistance on a YBCO thin-film area.
FIG. 4b shows, for various positions, the local resistance depending on the temperature.

At the positions I, II, and III further temperature-dependent measurements were performed for the classification of the observed inhomogeneities. The $R_s$—values at these positions are plotted in FIG. 4b over the temperature. These measurements show that the identified areas of the surface differ with respect to the temperature ($T_c$), the residual losses and also the curvature of the $R_s$(T) curves. It is finally possible to isolate herefrom responsible parameters such as scattering rates and grain boundary properties. The substrate with the thin film material sample measured can be removed from the quasi-hemispherical Fabry-Perot resonator after examination without damage and used for further examinations or it can be used in the manufacture of components.

What is claimed is:

1. A quasi-hemispherical Fabry-Perot resonator for the non-destructive and contact-free as well as temperature-dependent and localized determination of the surface resistance $R_s$ of electrically conductive thin material films, comprising disposed in a vacuum chamber: a spherical mirror having a center axis and delimiting a resonator space, said mirror having a high surface quality and two coupling openings for the incoupling and the out-coupling of a millimeter wave into, and out of, said resonator space, said in- and out-coupling openings being disposed adjacent each other and in close proximity to said center axis, a planar mirror arranged in spaced relationship from said spherical mirror so as to be centered on said center axis opposite said spherical mirror and delimiting the resonator space opposite said spherical mirror, said planar mirror having a high electrical conductivity and being adapted to support a wafer provided with a thin film material to be examined, a cryostat cooling arrangement connected to said mirrors for monitoring the mirrors for a predetermined temperature, said cooling arrangement including an inner and an outer radiation shield disposed within one another and enclosing said planar and spherical mirrors, said radiation shields being disposed in heat transfer uncoupled relationship and each including a base plate with cooling passages through which coolant is conducted and having metallic walls with mirrored surfaces;

the inner radiation shield enclosing said spherical and planar mirrors with the resonator space therebetween, said spherical mirror being supported on the base plate of said inner radiation shield in good heat transfer relation therewith, a support plate supporting said radiation shields, an extension arm supported at one end by said support plate and having an opposite end extending through said radiation shields into the interior thereof and carrying therein said planar mirror, the opposite end of said support arm being movable in the direction of said center axis and sidewardly, and also being rotatable and consisting of a material having a low heat conductivity, said planar mirror being mounted on said opposite end of said extension arm, said opposite end being disposed in heat transfer relation with said base plate by a flexible band of high heat conductivity and sufficient length to permit rotation of the planar mirror about the resonator axis by up to 360°, a first support arm mounted pivotally at one end centrally on said inner base plate and supporting at its other end a section of said inner radiation shield disposed opposite said spherical mirror and behind said planar mirror, a second support arm mounted pivotally at one end centrally on said outer base plate and supporting at its other end a section of said outer radiation shield disposed adjacent said inner radiation shield section, said end of said extension arm extending through said radiation shield sections and being engaged thereby such that said inner and outer radiation shield sections are carried along with said arm extension upon side movement thereof so that said inner and outer radiation shields remain closed to prevent radiation leaks, and both mirrors of said resonator having a heat capacity sufficient to render a thermal distortion of the resonator during a reading period for a resonance negligible.

2. A resonator according to claim 1, wherein said planar mirror includes a funnel-shaped rim structure opening toward the resonator for keeping said flexible band away from said resonator space during rotation of said planar mirror.

3. A resonator according to claim 2, wherein the walls of the free end of the extension arm, which extends through said inner and outer radiation shields and the support arms between the two base plates and the support plate consist of glass fiber reinforced plastic material.

4. A resonator according to claim 3, wherein said extension arm includes control elements for the movement of the extension arm and said control elements are disposed outside the inner and outer radiation shields.

5. A resonator according to claim 4, wherein heating elements are disposed on the base plate and on the planar mirror in the resonator space symmetrically to the resonator axis and temperature sensors are associated with said heating elements for monitoring the heat input of said heating elements.

6. A method for the non-destructive and contact-free, temperature-dependent and localized determination of the surface resistance $R_s$ of electrically conductive thin-film materials using a quasi-hemispherical Fabry-Perot resonator in which spherical and planar mirrors are disposed opposite each other in a double-shielded cooled resonator space structure supported on individual base plates and the planar mirror, on which a wafer with the thin material film is supported, is mounted on a support arm which extends through sections of the double shield structure, which are supported on pivot arms that are pivotally mounted on the center of the base plates and are engaged by the support arm such that they move along with the support arm when the support arm is moved sidewardly for a positioning change of the planar mirror, said method comprising the steps of:

clamping the wafer with the thin film material deposited thereon onto the planar mirror, moving the exposed surface of the wafer to a focus spot of a microwave coupled into the resonator, cooling the resonator by an evaporation cryostat by conducting coolant through the double shield structure surrounding the resonator, moving the planar mirror in position by position control means associated with the support arm and disposed outside the shield structure first by hand, while the resonator structure is open, so as to focus the resonator, position controlling the planar mirror under the control of a computer by lateral displacement and rotation of the support arm, so that the focus spot of the microwave coupled through an inlet opening in the spherical mirror is focused on a predetermined location on the exposed thin film surface on said wafer, detecting the localized reflection of the microwave on the thin film surface by way of an out-coupling opening disposed in said spherical mirror adjacent said inlet opening and transmitting the measured values for evaluation, recording the transmission of the microwave through the resonator as a function of the frequency by a sensitive detector system and parameterize the values in said computer by means of the method of the smaller error squares in accordance with a Lorentz distribution to provide a quality value Q, and, after elimination of the contributions caused by the spherical mirror and the in- and outcoupling openings from the quality value Q, determining the localized and temperature-dependent value of the surface resistance $R_s$ of the measured thin film material sample and processing it for documentation.

* * * * *